United States Patent
Mededovic et al.

(10) Patent No.: US 11,027,990 B2
(45) Date of Patent: Jun. 8, 2021

(54) PLASMA-BASED METHODS AND SYSTEMS FOR TREATING WATERS WITH HIGH ELECTRICAL CONDUCTIVITY AND/OR LOW SURFACE TENSION

(71) Applicants: Selma Mededovic, Potsdam, NY (US); Thomas Holsen, Colton, NY (US)

(72) Inventors: Selma Mededovic, Potsdam, NY (US); Thomas Holsen, Colton, NY (US)

(73) Assignee: Clarkson University, Potsdam, NY (US)

( * ) Notice: Subject to any disclaimer, the term of this patent is extended or adjusted under 35 U.S.C. 154(b) by 54 days.

(21) Appl. No.: 15/987,504

(22) Filed: May 23, 2018

(65) Prior Publication Data
US 2018/0339921 A1   Nov. 29, 2018

Related U.S. Application Data

(60) Provisional application No. 62/510,395, filed on May 24, 2017.

(51) Int. Cl.
*C02F 1/46* (2006.01)
*C02F 1/00* (2006.01)
(Continued)

(52) U.S. Cl.
CPC ...... *C02F 1/4608* (2013.01); *H01J 37/32449* (2013.01); *H01J 37/32458* (2013.01);
(Continued)

(58) Field of Classification Search
CPC .. C02F 1/4608; C02F 1/46; C02F 1/00; C02F 2101/301; C02F 2101/30; C02F 2101/00; C02F 2201/4619; C02F 2201/46105; C02F 2201/461; C02F 2201/46; C02F 2201/00; C02F 2305/023; C02F 2305/02; C02F 2305/00; H01J 37/00; H01J 37/32; H01J 37/241; H01J 37/3244; H01J 37/32449; H01J 37/32458; H01J 37/32431
See application file for complete search history.

(56) References Cited

U.S. PATENT DOCUMENTS 4,085,170 A * 4/1978 Simpson ................ B01D 11/02
                                                  261/1
2016/0228844 A1* 8/2016 Mededovic ............ B01J 19/088

FOREIGN PATENT DOCUMENTS

GB            653697 A  *  5/1951  ............. C01B 3/342
WO   WO-2015058122 A1 *  4/2015  ............... A23L 3/32

* cited by examiner

*Primary Examiner* — Natasha E Young
(74) *Attorney, Agent, or Firm* — Bond Schoeneck & King, PLLC

(57) ABSTRACT

An electrical discharge plasma reactor system for treating a liquid, the reactor system including: a reactor chamber configured to hold the liquid and a gas; a discharge electrode disposed within the reactor chamber, wherein the discharge electrode is disposed within the gas; an opposing electrode disposed within the gas within the reactor chamber; one or more gas diffusers disposed within the liquid, wherein the one or more gas diffusers is configured to induce the generation of a layer of foam on a surface of the liquid in a plasma-contact region; and a power supply connected to the discharge electrode and/or the opposing electrode, the power supply configured to induce the discharge electrode and the opposing electrode to generate plasma in the plasma-contact region.

18 Claims, 4 Drawing Sheets

(51) Int. Cl.
*H01J 37/32* (2006.01)
*H01J 37/00* (2006.01)
*C02F 101/30* (2006.01)
(52) U.S. Cl.
CPC .............................. *C02F 2101/301* (2013.01); *C02F 2201/4619* (2013.01); *C02F 2305/023* (2013.01)

100

```
┌─────────────────────────────────────────────────────────────────┐
│  Provide an electrical discharge plasma reactor including       │
│  a reactor chamber configured to hold a liquid and a gas        │
│                          110                                    │
└─────────────────────────────────────────────────────────────────┘
```
```
┌─────────────────────────────────────────────────────────────────┐
│  Position a discharge electrode and an opposing electrode in    │
│  the reactor chamber above a surface of the liquid              │
│                          120                                    │
└─────────────────────────────────────────────────────────────────┘
```
```
┌─────────────────────────────────────────────────────────────────┐
│  Generate a layer of foam on the surface of the liquid in a     │
│  plasma-contact region                                          │
│                          130                                    │
└─────────────────────────────────────────────────────────────────┘
```
```
┌─────────────────────────────────────────────────────────────────┐
│  Deliver voltage to generate plasma in the plasma-contact       │
│  region on the surface of the liquid                            │
│                          140                                    │
└─────────────────────────────────────────────────────────────────┘
```

FIG. 6

PLASMA-BASED METHODS AND SYSTEMS FOR TREATING WATERS WITH HIGH ELECTRICAL CONDUCTIVITY AND/OR LOW SURFACE TENSION

CROSS-REFERENCE TO RELATED APPLICATIONS

This application claims priority to U.S. Provisional Patent Application Ser. No. 62/510,395, filed on May 24, 2017, the entire disclosure of which is incorporated herein by reference.

FIELD OF THE INVENTION

The present disclosure is directed generally to methods and systems for treating liquid, and more specifically, to treating liquid using a plasma-based process.

BACKGROUND OF THE INVENTION

Removal of dissolved organic compounds from liquids, including drinking water and wastewater and microbial inactivation are required for the health and safety of the public and the environment and is therefore a standard step in water treatment processes.

Conventional methods for removing organic compounds from liquids and sterilization involve either physical operations with high energy requirements, or addition of chemical oxidants that may yield undesirable byproducts. For some chemicals, such as the per- and polyfluorinated compounds (PFAS) including perfluorooctanoic acid (PFOA) and perfluorooctanesulfonic acid (PFOS), these conventional methods are particularly inefficient. Advanced oxidation processes (AOPs), such as, ultraviolet/hydrogen peroxide, photocatalysis, and sonication use the highly oxidative hydroxyl (OH) radical to degrade chemical contaminants in water and inactivate microorganisms without producing potentially hazardous species. However, high energy requirements and/or costly chemical additives limit the feasibility of these technologies.

Gas-phase electrical discharge plasmas generated upon the surface of water have been shown to degrade dissolved organic compounds and inactivate microorganisms with high energy efficiency and no chemical additives. Similar to other AOPs, the effect of electrical discharge plasma is typically through the production of OH radicals. However, unlike many AOPs, the OH radicals are produced directly from the water, rather than through reactions with chemical additives (i.e., $H_2O_2$ or ozone). Additionally, plasma produces a diverse selection of other reactive species in addition to oxidants (O., H., $O_3$, $H_2O_2$, $e_{aq}$, $Ar^+$), which allow it to rapidly degrade chemicals that are not treatable by other AOPs. Important examples of such chemicals are perfluorooctanoic acid (PFOA) and perfluoroctanesulfonic acid (PFOS), which are increasingly important environmental pollutants that cannot be efficiently oxidized, but are rapidly degraded by plasma. A promising method for treating PFAS-contaminated water involves using physical treatment processes (i.e., reverse osmosis or ion-exchange processes) that produce a concentrated wastewater, which can then be treated by plasma. This wastewater has much higher concentrations of salts and PFASs, which cause the solutions to have much higher electrical conductivity and much lower surface tension. Unfortunately, high electrical conductivity causes a dramatic reduction in the physical size of the plasma discharge, which reduces the plasma-liquid contact area and thus the efficiency of the plasma treatment.

Accordingly, there is a need in the art for more effective and affordable methods and systems for removing organic compounds from liquids with high electrical conductivity and/or low surface tension using a plasma-based process.

SUMMARY OF THE INVENTION

The present disclosure is directed to inventive methods and systems for treating a liquid using an enhanced contact electrical discharge plasma reactor. Various embodiments and implementations herein are directed to an apparatus and method in which voltage is applied to one or more electrodes to generate electrical discharge plasma upon the surface of a liquid, where a layer of foam may be generated. A discharge electrode and an opposing electrode (either grounded or of opposite polarity to the discharge electrode) are placed in a gas above the surface of the liquid to be treated. In doing so, plasma may be generated from the discharge electrode and travel to the opposing electrode to increase the area of contact between the plasma and the liquid.

Generally, in one aspect, an electrical discharge plasma reactor system for treating a liquid is provided. The system includes (i) a reactor chamber configured to hold the liquid and a gas; (ii) a discharge electrode disposed within the reactor chamber, wherein the discharge electrode is disposed within the gas; (iii) an opposing electrode disposed within the gas within the reactor chamber; (iv) one or more gas diffusers disposed within the liquid, wherein the one or more gas diffusers is configured to induce the generation of a layer of foam on a surface of the liquid in a plasma-contact region; and (v) a power supply connected to the discharge electrode and/or the opposing electrode, the power supply configured to induce the discharge electrode and the opposing electrode to generate plasma in the plasma-contact region.

In one embodiment, the discharge electrode and the opposing electrode are separated by a distance such that the plasma generated forms a continuous spark that contacts the surface of the liquid as it spans the distance between the electrodes.

In one embodiment, the one or more gas diffusers includes a plurality of gas diffusers and each gas diffuser has a different gas flowrate to induce the generation of foam on the surface of the liquid.

In one embodiment, the discharge electrode and the opposing electrode are separated by a distance such that the plasma generated forms distinct discharges that contact the surface of the liquid.

Generally, in another aspect, an electrical discharge plasma reactor system for treating a liquid is provided. The system includes (i) a reactor chamber configured to hold the liquid and a gas; (ii) a discharge electrode disposed within the reactor chamber, wherein the discharge electrode is disposed within the gas; (iii) an opposing electrode disposed within the gas within the reactor chamber; and (iv) a power supply connected to the discharge electrode and/or the opposing electrode, the power supply configured to induce the discharge electrode and the opposing electrode to generate plasma in a plasma-contact region. The discharge electrode and the opposing electrode are separated by a distance such that the plasma generated forms a continuous spark that contacts a surface of the liquid as it spans the distance between the electrodes.

In one embodiment, there is no use of a gas diffuser to generate foam on the surface of the liquid.

In one embodiment, the system further includes a weir configured to obstruct electrolytic conduction through the liquid in a region between the discharge electrode and opposing electrode.

In one embodiment, the system further includes one or more gas diffusers to generate foam on the surface of the liquid and each gas diffuser has a different gas flowrate.

Generally, in a further aspect, a method for treating a liquid is provided. The method includes (i) providing an electrical discharge plasma reactor including a reactor chamber configured to hold the liquid and a gas; (ii) positioning a discharge electrode in the reactor chamber above a surface of the liquid; (iii) positioning an opposing electrode in the reactor chamber above the surface of the liquid, wherein the opposing electrode is separated from the discharge electrode by an inter-electrode gap; and (iv) delivering voltage to at least the discharge electrode and inducing the discharge electrode and the opposing electrode to generate plasma in a plasma-contact region on the surface of the liquid to degrade at least one component dissolved within the liquid.

In one embodiment, the method further includes generating foam in the plasma-contact region on the surface of the liquid.

In one embodiment, the method further includes bubbling gas through a diffuser to generate the foam on the surface of the liquid.

In one embodiment, the diffuser is arranged at least partially within the liquid and beneath the surface of the liquid.

In one embodiment, the method further includes generating a continuous spark that spans the inter-electrode gap between the discharge electrode and the opposing electrode, wherein the continuous spark contacts the surface of the liquid.

In one embodiment, the method further includes generating discrete plasma discharges from the discharge electrode and the opposing electrode, each contacting the surface of the liquid.

In one embodiment, the method further includes positioning an obstructive weir within the liquid between the discharge electrode and the opposing electrode to form a continuous spark.

In one embodiment, the method further includes bubbling gas through first and second diffusers to generate the foam on the surface of the liquid, wherein the first and second diffusers have different gas flowrates.

In one embodiment, the gas flowrates of the first and second diffusers depend on where each diffuser is located within the reactor.

In one embodiment, each of the discharge electrode and the opposing electrode is arranged a distance from the surface of the liquid and the distance is smaller than the inter-electrode gap.

In one embodiment, the inter-electrode gap depends on a conductivity of the liquid.

In one embodiment, the discharge electrode and the opposing electrode are at least partially disposed within the gas of the reactor chamber.

These and other aspects of the invention will be apparent from the embodiment(s) described hereinafter.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

FIG. 6 is a flowchart of a method for treating a liquid, in accordance with an embodiment.

DETAILED DESCRIPTION

The present disclosure describes methods and systems for treating liquids, such as, drinking water, groundwater, wastewater, and concentrated waste streams from reverse osmosis and ion exchange, for example, brine concentrate, among other liquids. An enhanced contact electrical discharge plasma reactor is used, for example, to degrade organic compounds present in a liquid. For liquids having high electrical conductivities and/or much lower surface tension, the physical size of the plasma discharge is dramatically reduced. Since a reduction in the physical size of the plasma discharge causes a reduction of the plasma-liquid contact area and thus the efficiency of the plasma treatment, it is beneficial to provide an electrode configuration that increases the plasma-liquid contact area. For example, voltage can be applied to one or more electrodes to generate one or more continuous sparks upon the surface of a liquid and a layer of foam is generated on the liquid surface. By way of another example, voltage can be applied to one or more electrodes to generate one or more distinct discrete plasma discharges and a layer of foam is generated on the liquid surface. Compared to traditional sterilization and advanced processing techniques including plasma reactors with unmodified electrode configurations, the processes described herein or otherwise envisioned require significantly less energy and are significantly faster in degrading the contaminants, thereby resulting in significant cost and efficiency savings. For liquids having high electrical conductivities and/or much lower surface tension, the electrode configurations described herein or otherwise envisioned achieve higher treatment efficiencies than those in which the opposing electrode it disposed in the liquid.

According to an embodiment, the process is capable of degrading dissolved organic compounds in a liquid, including but not limited to pharmaceuticals, personal care products, endocrine disrupting compounds, agricultural pesticides and herbicides, and/or organic dyes, among many others. Advantageously, the process does not produce organic compounds byproducts, and does not require chemical additives. The system is also less sensitive than other plasma systems to the electrical conductivity of the water being treated, and no erosion of the electrode occurs. Further, the system is highly modular, and treatment capacity can be increased. Moreover, the electrode configurations described herein or otherwise envisioned reduce the sensitivity to the highly stable foam that may be formed when the surface tension is very low.

Figure 1:
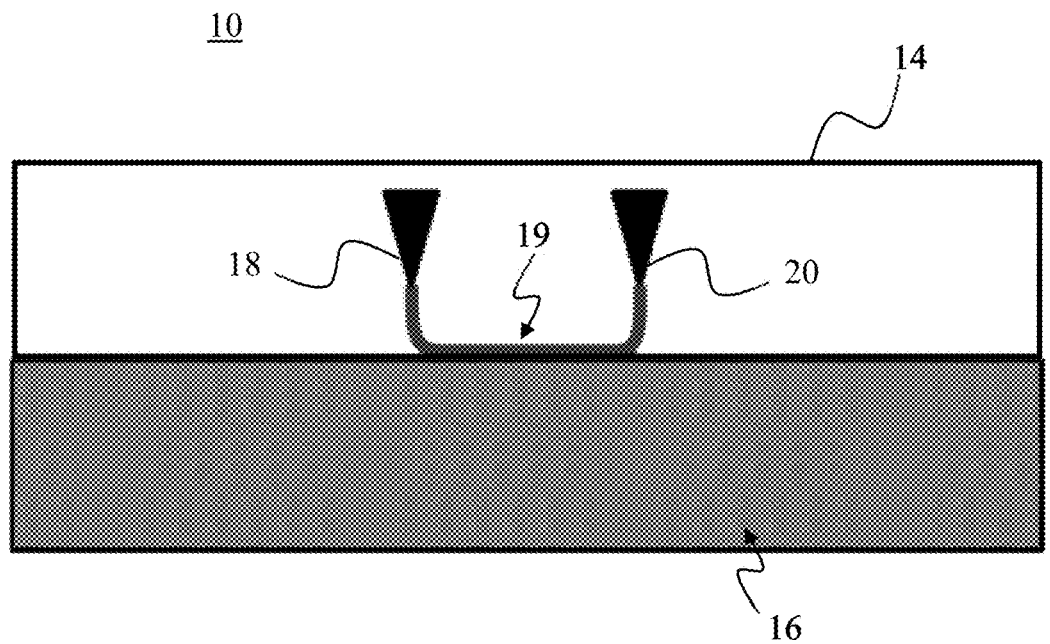
FIG. 1 is a schematic representation of a system for treatment of a liquid, in accordance with an embodiment.

Referring now to the drawings, wherein like reference numerals refer to like parts throughout, there is seen in FIG. 1, in one embodiment, an electrical discharge plasma reactor configuration for degradation of organic compounds or microbial inactivation. According to an embodiment, the electrical discharge plasma reactor 10 includes a chamber 14. Chamber 14 can be very small or very large, as long as there is sufficient voltage, and thus sufficient plasma, to treat the liquid within the chamber. Chamber 14 can include liquid 16 to be treated. The liquid can be any liquid for which treatment is desired, including but not limited to drinking water, groundwater, wastewater, concentrate from a physical process step preceding the plasma treatment, or any of a wide variety of liquids. The liquid can be, for example, any liquid containing water, milk, juice, or any other consumable liquid, and could be a liquid or semi-liquid food, among many other possibilities.

Chamber 14 also comprises a first electrode 18 and a second opposing electrode 20, where electrode 18 is the discharge electrode. The discharge electrode 18 and the opposing electrode 20 are positioned above the surface of the liquid and thus within the gas within chamber 14. The configuration of electrodes in the reactor in FIG. 1 can be any configuration where one of electrodes 18 and 20 is the anode and the other is the cathode. According to an embodiment, the electrodes can be composed in part or entirely of metal or metal alloy such as silver, stainless steel, and carbon, among others, and can be a plate, tube, wire, and/or many other configurations. According to another embodiment, the electrodes can be composed of reticulated vitreous carbon, and or a metal tube. During operation of the reactor, a power supply can supply voltages ranging from approximately 100 to 100,000 V DC, pulsed DC, or AC of any frequency, for example, although other voltages are possible.

Additionally, each electrical discharge plasma reactor 10 can include a liquid inlet and a liquid outlet, which may optionally be the same component. Each electrical discharge plasma reactor 10 also includes a power supply to supply voltages ranging from approximately 100 to 100,000 V DC, pulsed DC, or AC of any frequency, for example, to the discharge electrode 18.

According to the embodiment shown in FIG. 1, the distance between the first electrode 18 and the second opposing electrode 20 and the distances between each electrode and the liquid surface may be specified such that the plasma discharges generated from each electrode form a continuous spark 19. The continuous spark 19 extends between the discharge electrode 18 and the opposing electrode 20 while contacting the liquid surface. In other words, continuous spark 19 contacts the liquid surface as it spans the distance between the two electrodes. In an example embodiment, the length of the continuous spark 19 is maximized as this determines the area of contact between the plasma and the liquid. The continuous spark 19 achieves an increased plasma contact area since a broader region of the liquid surface is exposed to the plasma. Thus, an increased treatment rate can be achieved with continuous spark 19.

Figure 2:
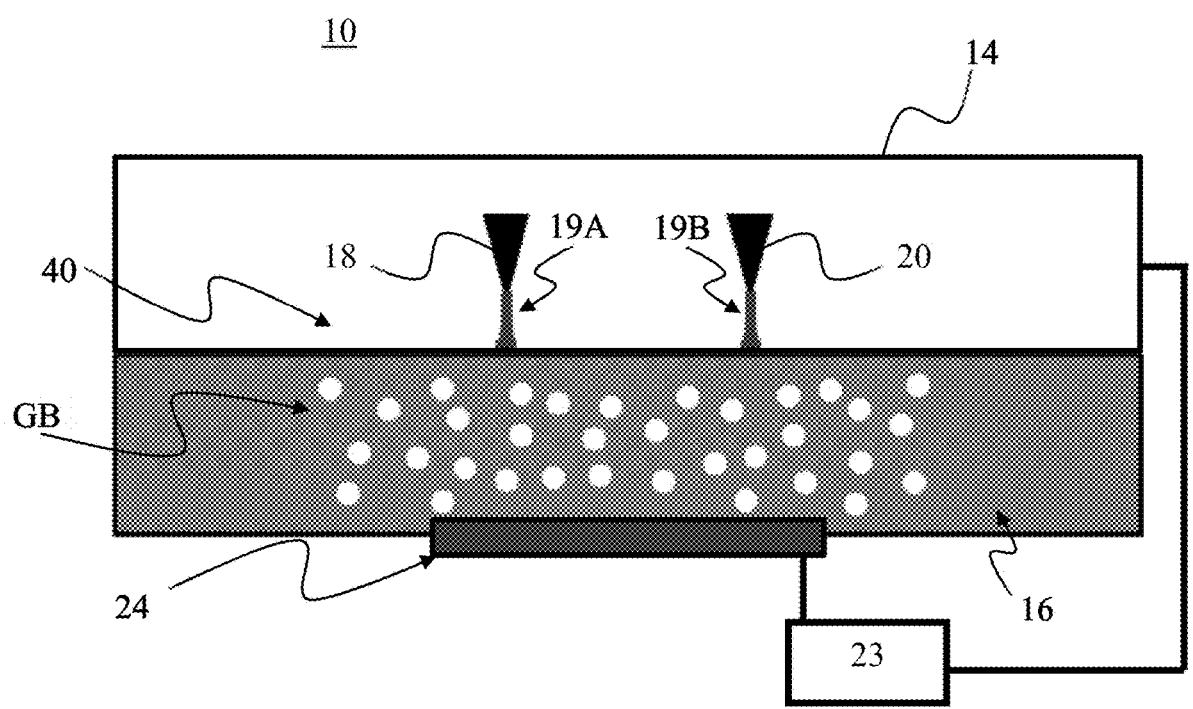
FIG. 2 is a schematic representation of a system for treatment of a liquid, in accordance with an embodiment.

According to another embodiment (as shown in FIG. 2), the distance between the discharge electrode 18 and the opposing electrode 20 and the distances between each electrode and the liquid surface may be specified such that the plasma discharges 19A and 19B are generated from each electrode and remain separate and distinct.

According to the embodiment of FIG. 2, electrical discharge plasma reactor 10 includes a gas pump 23. For example, gas pump 23 can pump a gas to create foam within the chamber 14 at a plasma-contact region, indicated broadly by numeral 40. To create foam, the reactor can include a gas diffuser 24 that produces gas bubbles GB by bubbling gas beneath the liquid surface, as shown in FIG. 2. As another embodiment, the gas pump can include a high velocity liquid jet in the gas phase to churn the bulk liquid. This layer of foam increases the surface density of surfactant-like contaminants in the liquid in the plasma-contacted region, which enhances the contact between the liquid and the plasma. Since treatment rate is directly proportional to the plasma-liquid contact area, this foam is highly beneficial for the process.

According to an embodiment, the gas pump of the electrical discharge plasma reactor 10, and/or a separate gas pump, is utilized to pump a gas into the chamber 14. According to an embodiment, a large volume of gas can be continuously pumped through the diffusers causing foam to be generated at a healthy rate. In an example embodiment, the system includes a gas recycler configured to capture and reuse a gas through the reaction chamber, through the diffusers, and/or via a gas inlet and outlet. Electrical discharge plasmas in humid air can lead to the production of nitrates and nitrites, which can then accumulate in the water. Because federal agencies enforce quality standards regarding the maximum concentrations of nitrate and nitrite in drinking water, a neutral gas such as argon—among many other types of gases—can be used when treating drinking water. In this case, the plasma causes very little change in the composition of the argon; therefore, the argon may be recycled to minimize operating costs. When treating wastewater, air may be used instead of argon, because wastewater need not satisfy quality standards regarding nitrate and nitrite concentrations. According to an embodiment, the foam can be generated using the same argon, air, or other gas pumped into the gas portion of chamber 14. If oxygen or air serve as process gases, their composition will not be entirely preserved in the presence of plasma, however, they can likely still be recycled to a substantial degree, and in doing so, allows for the utilization of any ozone that is produced by the plasma, which can further benefit the process through increased treatment rate. The gas recycler obtains the gas from the reaction chamber and stores or immediately cycles that reclaimed gas into the reaction chamber via the gas diffuser and/or via a gas inlet. A gas pump such as the one shown in FIG. 2 can be incorporated within any of the systems described herein or otherwise envisioned with the gas diffuser 24 as a gas inlet and a gas outlet.

The systems are effective for a wide range of electrical conductivities, and yet the energy consumption of the process is lower than that of the existing processes for inactivation or chemical degradation. The reactor can, for example, be made of glass or any other material, and the systems described herein are effective with or without chemical and/or biological additives.

Figure 3:
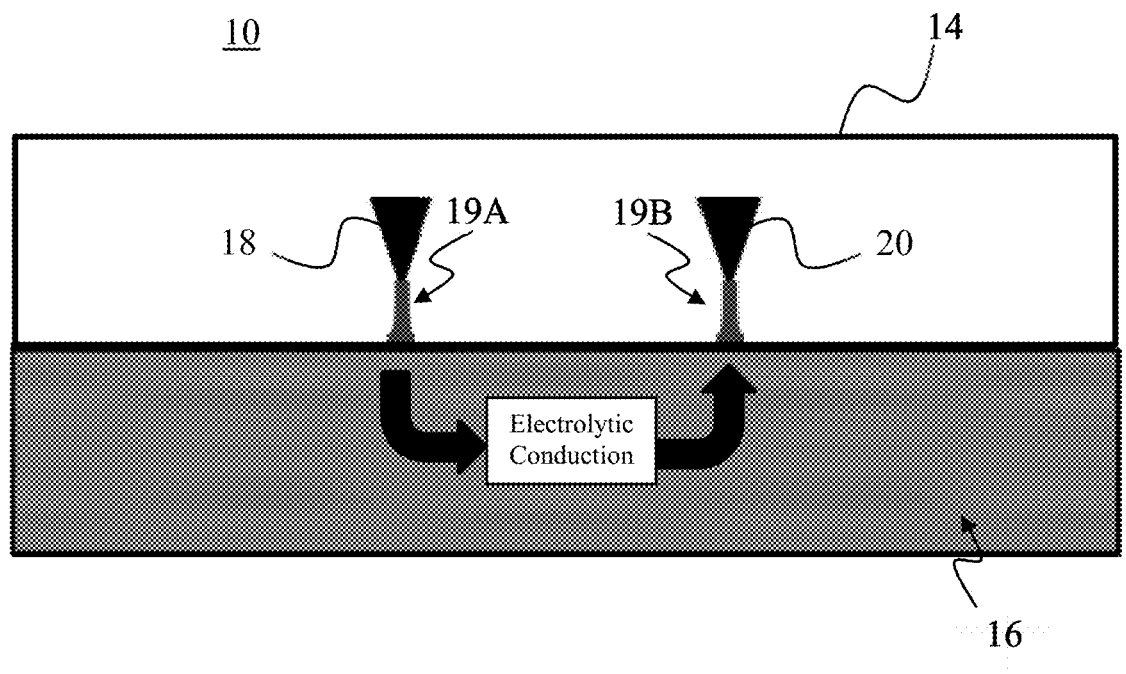
FIG. 3 is a schematic representation of a system for treatment of a liquid, in accordance with an embodiment.

As solution conductivity increases, the maximum achievable spark length decreases due to the electrolytic conduction occurring in the bulk liquid in the region between the two electrodes. For a given conductivity of the liquid 16, if the inter-electrode distance is too large, the plasma will form two distinct discharges rather than as a continuous spark as shown in FIG. 3. The inter-electrode distance shown in FIG. 3 is larger than the inter-electrode distance shown in FIG. 2.

Figure 4:
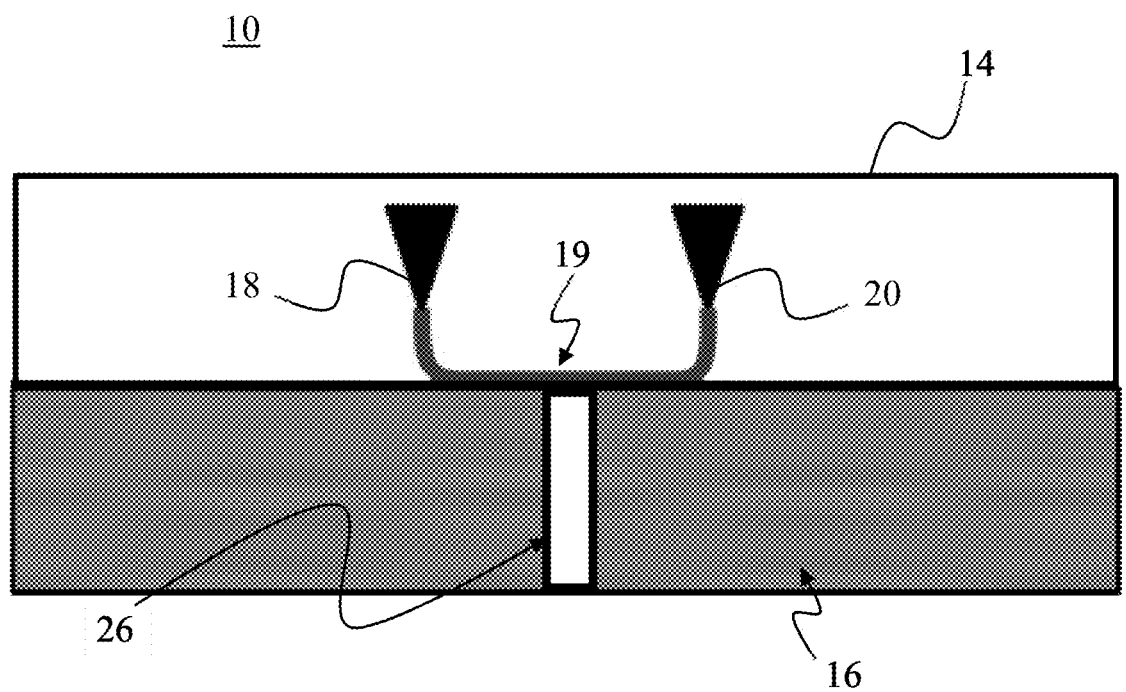
FIG. 4 is a schematic representation of a system for treatment of a liquid, in accordance with an embodiment.

To increase the maximum achievable spark length, a weir 26 may be introduced within the liquid to obstruct the electrolytic conduction through the bulk liquid as shown in FIG. 4 for example. The introduction of the weir 26 reduces the conductance of the bulk liquid in the region between the two electrodes to enable the formation of continuous spark 19 across the liquid surface. Weir 26 can be made of any material, or be any shape, sufficient to alter a circulation pattern of the liquid within the reactor chamber. For example, the weirs can be plastic or metal, among many other materials.

According to an embodiment where the liquid 16 to be treated contains high concentrations of surfactants (as with concentrated waste streams from reverse osmosis and ion exchange), the surface tension can be reduced far below that of pure water. This reduced surface tension can increase the stability of the foam generated on the liquid surface, and may cause it to accumulate if the bubbling rate is too high. Excessive accumulation of foam may negatively influence the properties of the plasma discharge. On the other hand, too little accumulation of foam can reduce the area density in the plasma-contacted region and thus reduce treatment efficiency. Additionally, as the extent of surfactant transformation increases during the treatment, the surface tension can increase, causing a decrease in the degree of foam accumulation.

Figure 5:
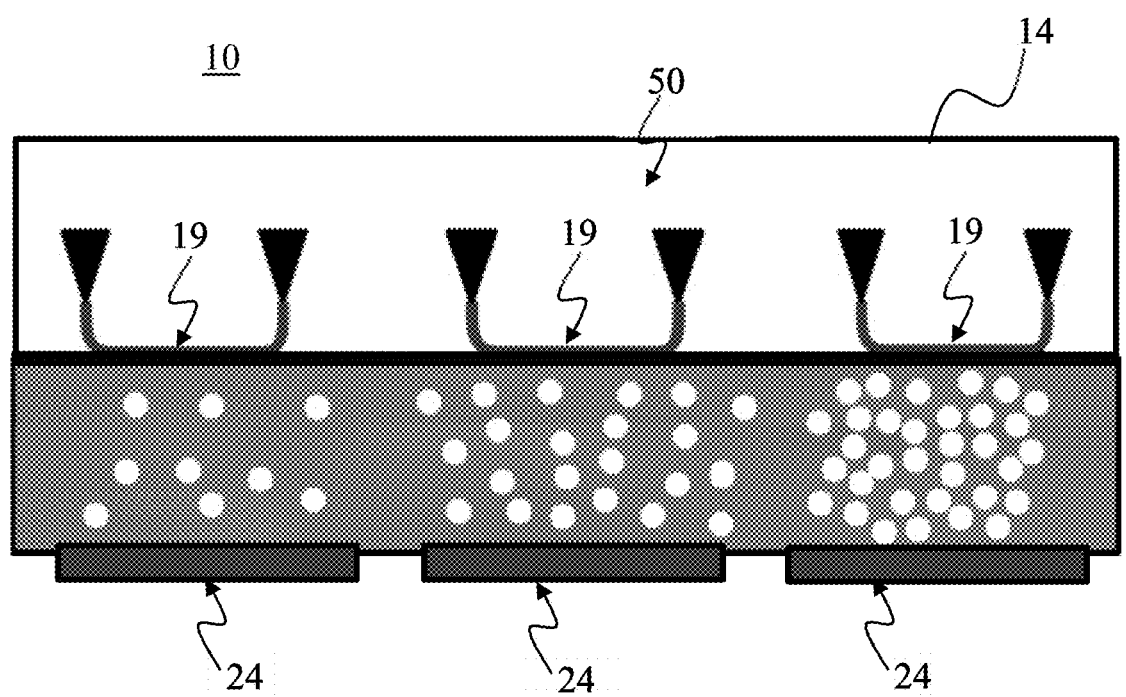
FIG. 5 is a schematic representation of a system for treatment of a liquid, in accordance with an embodiment.

To ensure optimal foam generation rates at different extents of treatment, multiple gas diffusers may be employed, with the bubbling rate for each varying based on its location within the reactor as shown in FIG. 5. In FIG. 5, the liquid is moving from left to right, surfactant concentrations are decreasing, and the bubbling rate is increasing. Utilizing multiple gas diffusers 24 and a bubbling rate gradient can assure optimal foam accumulation at all stages of the process of treating the liquid 16. As shown in FIG. 5, additional electrode assemblies 50 can be included, each assembly configured to generate a continuous spark 19.

Further, although the reactors depicted in the drawings are shown with only two or six electrodes, they can additionally or optionally comprise any number of electrodes. For example, there can be a mesh electrode, an electrode with multiple points or needles, and a variety of other types of electrodes to optimize the flow of energy and to direct the optimized creation of plasma.

According to an embodiment is a method 100 for treatment of a liquid in which electrical discharges at the two electrodes result in the formation of a plasma. At an initial step of an exemplary method 110, an electrical discharge plasma reactor 10 for treatment of a liquid is provided. System or reactor 10 may be any of the embodiments described herein or otherwise envisioned, and can include, for example, any of the reactors and/or systems described in conjunction with the figures. For example, system or reactor 10 can include a chamber 14 with liquid 16, and, at step 120, a first electrode 18 and a second electrode 20 can be positioned above the liquid 16. One or both of first electrode 18 and/or second electrode 20 can be a plate, tube, wire, mesh and/or foam, among many other configurations. According to an embodiment, one or more of the electrodes can be composed of metal and/or reticulated vitreous carbon among many other components.

In the next step of the method 130, foam is generated on the liquid surface to increase surface density in the plasma region, increase mass transfer of surface-active species, and/or increase the rate at which bulk liquid is drawn to the surface. According to an embodiment, foam may be generated by directing a turbulent or laminar liquid jet towards the surface to agitate and churn the liquid or by bubbling gas through a diffuser submerged beneath the liquid surface, after which the gas may be recirculated. For purposes of this disclosure, a "foam" can mean a wide variety of physical configurations. A foam may simply be, for example, a plurality of bubbles of gas on the surface of a liquid. A foam may or may not comprise a surfactant or other foaming agent.

In the next step of the method 140, voltage is delivered to the discharge electrode. During operation, a power supply can supply voltages ranging from approximately 100 to 100,000 V DC, pulsed DC, or AC of any frequency, for example, although other voltages are possible. Plasma is generated for a sufficient amount of time to allow for the degradation of components or compounds in the liquid. This amount of time is shorter than normal due to the higher efficiency of the system, and can vary depending upon the liquid, feedback information, sensor information, temperature and pressure, and a variety of other factors.

According to an embodiment, the discharge and opposing electrodes are positioned to generate a continuous spark that spans the inter-electrode gap in contact with the liquid surface. According to another example embodiment, the discharge and opposing electrodes are positioned to generate separate discrete plasma discharges to contact the liquid surface.

Although the present invention has been described in connection with a preferred embodiment, it should be understood that modifications, alterations, and additions can be made to the invention without departing from the scope of the invention as defined by the claims.

What is claimed is:

1. An electrical discharge plasma reactor system for treating a liquid, the reactor system comprising:
    a reactor chamber configured to hold the liquid and a gas;
    a discharge electrode disposed within the reactor chamber, wherein the discharge electrode is disposed within the gas;
    an opposing electrode disposed within the gas within the reactor chamber;
    one or more gas diffusers disposed within the liquid, wherein the one or more gas diffusers is configured to induce the generation of a layer of foam on a surface of the liquid in a plasma-contact region;
    wherein the one or more gas diffusers are connected to the reactor chamber beneath the liquid, which is between the one or more gas diffusers and the gas; and
    a power supply connected to the discharge electrode and/or the opposing electrode, the power supply configured to induce the discharge electrode and the opposing electrode to generate plasma in the plasma-contact region.

2. The system of claim 1, wherein the discharge electrode and the opposing electrode are separated by a distance such that the plasma generated forms a continuous spark that contacts the surface of the liquid as it spans the distance between the electrodes.

3. The system of claim 1, wherein the one or more gas diffusers comprises a plurality of gas diffusers and each gas diffuser has a different gas flowrate to induce the generation of foam on the surface of the liquid.

4. The system of claim 1, wherein the discharge electrode and the opposing electrode are separated by a distance such that the plasma generated forms distinct discharges that contact the surface of the liquid.

5. An electrical discharge plasma reactor system for treating a liquid, the reactor system comprising:
    a reactor chamber configured to hold the liquid and a gas;
    a discharge electrode disposed within the reactor chamber, wherein the discharge electrode is disposed within the gas;

an opposing electrode disposed within the gas within the reactor chamber;

one or more gas diffusers disposed within the liquid, wherein the one or more gas diffusers is configured to induce the generation of a layer of foam on a surface of the liquid in a plasma-contact region;

wherein the one or more gas diffusers are connected to the reactor chamber beneath the liquid, which is between the one or more gas diffusers and the gas; and a power supply connected to the discharge electrode and/or the opposing electrode, the power supply configured to induce the discharge electrode and the opposing electrode to generate plasma in a plasma-contact region;

wherein the discharge electrode and the opposing electrode are separated by a distance such that the plasma generated forms a continuous spark that contacts a surface of the liquid as it spans the distance between the electrodes.

6. The system of claim 5, further comprising a weir configured to obstruct electrolytic conduction through the liquid in a region between the discharge electrode and opposing electrode.

7. The system of claim 5, wherein each gas diffuser of the one or more gas diffusers has a different gas flowrate.

8. A method for treating a liquid, the method comprising the steps of:

providing an electrical discharge plasma reactor including a reactor chamber configured to hold the liquid and a gas;

positioning a discharge electrode in the reactor chamber above a surface of the liquid;

positioning an opposing electrode in the reactor chamber above the surface of the liquid, wherein the opposing electrode is separated from the discharge electrode by an interelectrode gap;

delivering voltage to at least the discharge electrode and inducing the discharge electrode and the opposing electrode to generate plasma in a plasma-contact region on the surface of the liquid to degrade at least one component dissolved within the liquid; and generating foam in the plasma-contact region on the surface of the liquid.

9. The method of claim 8, further comprising the step of bubbling gas through a diffuser to generate the foam on the surface of the liquid.

10. The method of claim 9, wherein the diffuser is arranged at least partially within the liquid and beneath the surface of the liquid.

11. The method of claim 8, further comprising the step of generating a continuous spark that spans the inter-electrode gap between the discharge electrode and the opposing electrode, wherein the continuous spark contacts the surface of the liquid.

12. The method of claim 8, further comprising the step of generating discrete plasma discharges from the discharge electrode and the opposing electrode, each contacting the surface of the liquid.

13. The method of claim 12, further comprising the step of positioning an obstructive weir within the liquid between the discharge electrode and the opposing electrode to form a continuous spark.

14. The method of claim 8, further comprising the step of bubbling gas through first and second diffusers to generate the foam on the surface of the liquid, wherein the first and second diffusers have different gas flowrates.

15. The method of claim 14, wherein the gas flowrates of the first and second diffusers depend on where each diffuser is located within the reactor.

16. The method of claim 8, wherein each of the discharge electrode and the opposing electrode is arranged a distance from the surface of the liquid and the distance is smaller than the inter-electrode gap.

17. The method of claim 8, wherein the inter-electrode gap depends on a conductivity of the liquid.

18. The method of claim 8, wherein the discharge electrode and the opposing electrode are at least partially disposed within the gas of the reactor chamber.

* * * * *